United States Patent
Andreas

(10) Patent No.: US 7,151,026 B2
(45) Date of Patent: *Dec. 19, 2006

(54) SEMICONDUCTOR PROCESSING METHODS

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/291,508

(22) Filed: Dec. 1, 2005

(65) Prior Publication Data

US 2006/0134860 A1 Jun. 22, 2006

Related U.S. Application Data

(60) Continuation of application No. 10/218,252, filed on Aug. 13, 2002, now Pat. No. 6,972,227, which is a division of application No. 09/583,460, filed on May 30, 2000, now Pat. No. 6,613,674, which is a continuation of application No. 08/968,083, filed on Nov. 12, 1997, now abandoned.

(51) Int. Cl.
*H01L 21/304* (2006.01)

(52) U.S. Cl. .................. 438/253; 438/238; 438/396; 438/692; 438/753; 438/906; 438/928

(58) Field of Classification Search ............... 438/238, 438/253, 396, 692, 753, 958, 906, 928
See application file for complete search history.

(56) References Cited

U.S. PATENT DOCUMENTS 5,645,682 A 7/1997 Skrovan
5,663,096 A 9/1997 Okabe et al.
5,681,425 A 10/1997 Chen
5,731,243 A 3/1998 Peng et al.
5,779,520 A 7/1998 Hayakawa
5,801,104 A 9/1998 Schuegraf et al.
5,879,226 A 3/1999 Robinson
5,914,278 A 6/1999 Boitnott et al.
5,994,188 A 11/1999 Disney
6,025,247 A 2/2000 Chang et al.
6,136,510 A 10/2000 La et al.
6,152,148 A 11/2000 George et al.
6,331,720 B1 12/2001 Parekh et al.

*Primary Examiner*—George Fourson
(74) *Attorney, Agent, or Firm*—Wells St. John P.S.

(57) ABSTRACT

Semiconductor processing methods are described which can be used to reduce the chances of an inadvertent contamination during processing. In one implementation, a semiconductor wafer backside is mechanically scrubbed to remove an undesired material prior to forming a final passivation layer over an oppositely facing semiconductor wafer frontside. In another implementation, the wafer backside is treated to remove the undesired material while treatment of the wafer frontside is restricted. In another implementation, the mechanical scrubbing of the wafer backside is conducted in connection with a polishing solution which is effective to facilitate removal of undesired material from the wafer backside. In a preferred implementation, dynamic random access memory storage capacitors are formed and the undesired material constitutes remnant polysilicon which adheres to the wafer backside during formation of a frontside capacitor storage node. In accordance with this implementation, the wafer backside is mechanically scrubbed prior to formation of a storage capacitor dielectric layer, with such mechanical scrubbing taking place in connection with a polishing solution comprising tetramethyl ammonium hydroxide (TMAH) having a desired concentration.

37 Claims, 7 Drawing Sheets

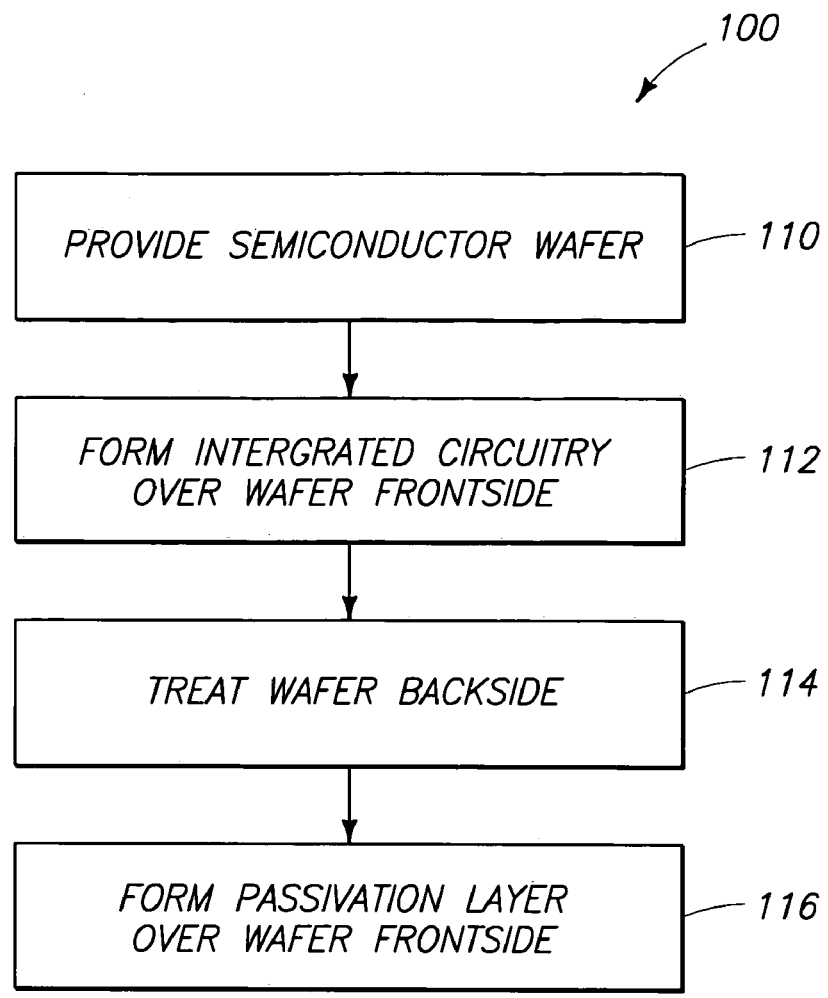
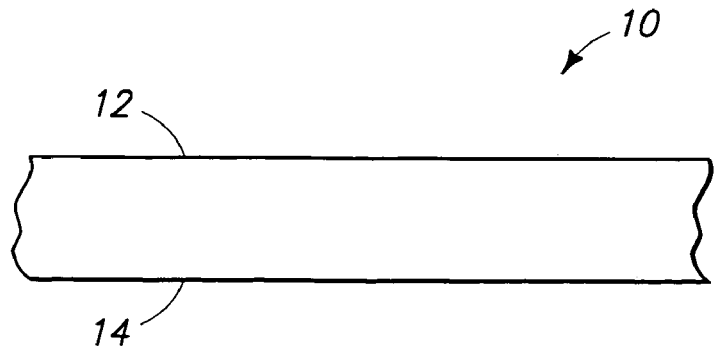

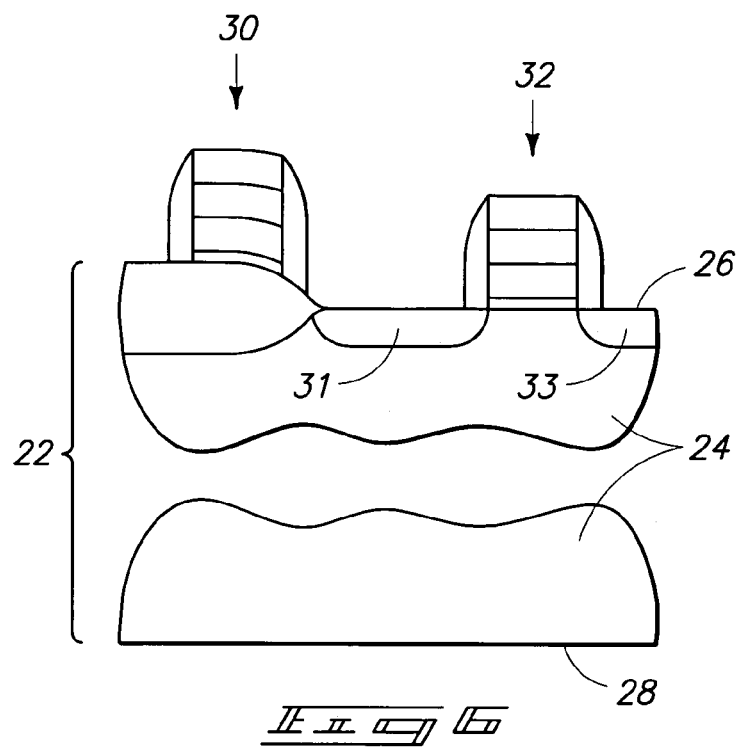
_Fig 6_
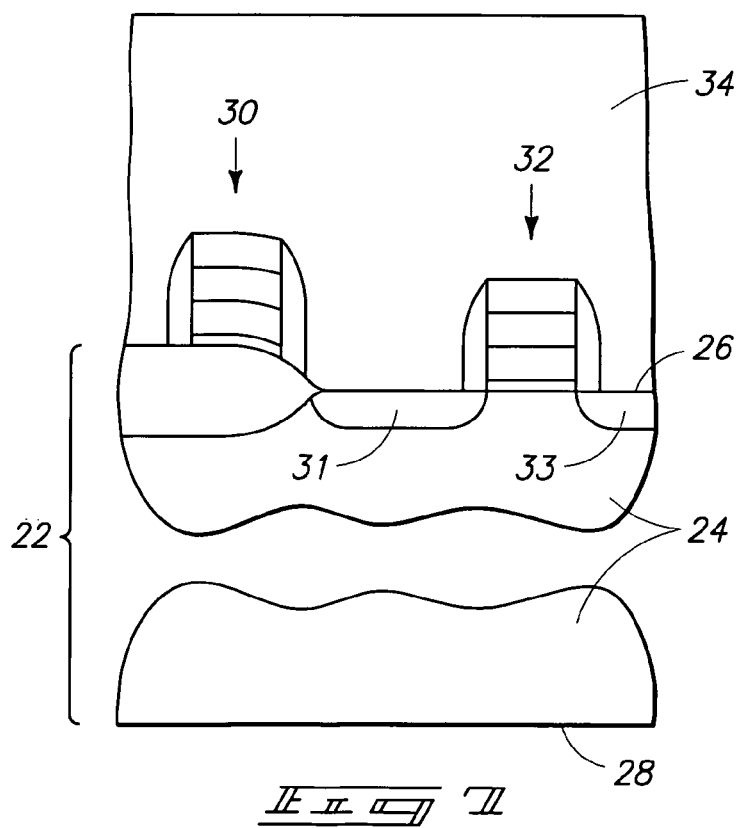
_Fig 7_

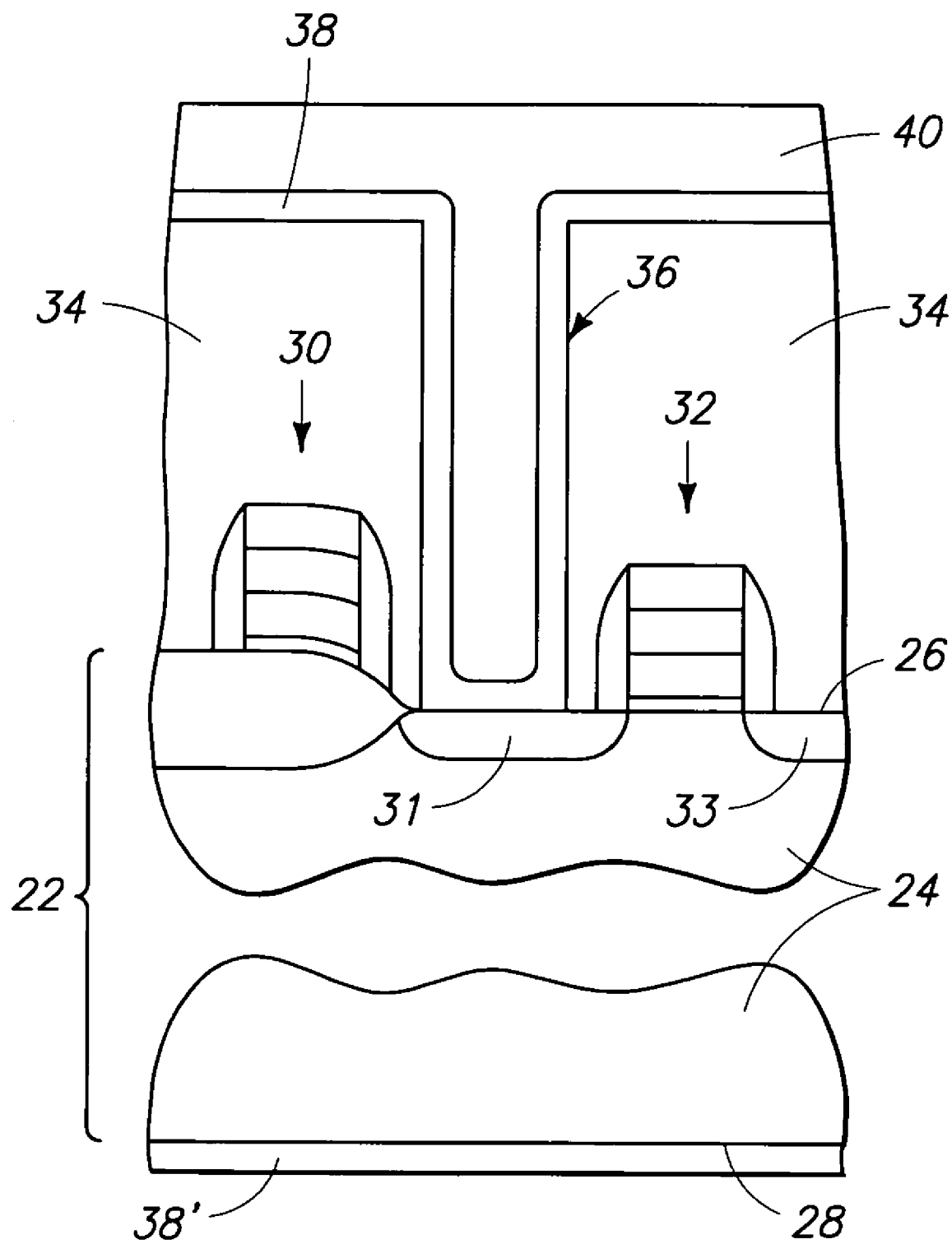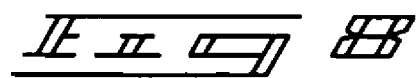

SEMICONDUCTOR PROCESSING METHODS

RELATED PATENT DATA

This patent resulted from a continuation application of U.S. patent application Ser. No. 10/218,252, filed Aug. 13, 2002, entitled "Semiconductor Processing Methods, and Methods of Forming a Dynamic Random Access Memory (DRAM) Storage Capacitor", naming Michael T. Andreas as inventor, now U.S. Pat. No. 6,972,227, the disclosure of which is incorporated by reference; which patent resulted from a divisional application of U.S. patent application Ser. No. 09/583,460, filed May 30, 2000, entitled "Semiconductor Processing Methods of Forming Integrated Circuitry, and Methods of Forming Dynamic Random Access Memory Circuitry", naming Michael T. Andreas as inventor, now U.S. Pat. No. 6,613,674, the disclosure of which is incorporated by reference; which patent resulted from a continuation application of U.S. patent application Ser. No. 08/968,083, filed Nov. 12, 1997, now abandoned entitled "Semiconductor Processing Methods of Forming Integrated Circuitry, and Methods of Forming Dynamic Random Access Memory Circuitry", naming Michael T. Andreas as inventor, the disclosure of which is incorporated by reference.

TECHNICAL FIELD

This invention relates to semiconductor processing methods, and more particularly it concerns removing undesired material from a semiconductor wafer backside to reduce a risk of inadvertent contamination. The invention also concerns methods of forming integrated circuitry, and in particular methods of forming dynamic random access memory storage capacitors.

BACKGROUND OF THE INVENTION

Semiconductor processing includes deposition of different materials over a semiconductor wafer. Such materials are typically deposited on a wafer which is placed within a reactor, such as a chemical vapor deposition reactor. During deposition, the material being deposited typically deposits over the entire wafer, including the wafer backside, and on the interior walls of the deposition reactor and the equipment used to support the wafer during processing. Material deposited on the wafer backside is problematic because it can become dislodged during downstream processing and contaminate the frontside of the wafer.

This invention arose out of concerns associated with improving the manner in which semiconductor wafers are processed. This invention also arose out of concerns associated with reducing the chances of inadvertent contamination during semiconductor wafer processing.

SUMMARY OF THE INVENTION

Semiconductor processing methods are described which can be used to reduce the chances of an inadvertent contamination during processing. In one implementation, a semiconductor wafer backside is mechanically scrubbed to remove an undesired material prior to forming a final passivation layer over an oppositely facing semiconductor wafer frontside. In another implementation, the wafer backside is treated to remove the undesired material while treatment of the wafer frontside is restricted. In another implementation, the mechanical scrubbing of the wafer backside is conducted in connection with a polishing solution which is effective to facilitate removal of undesired material from the wafer backside. In a preferred implementation, dynamic random access memory storage capacitors are formed and the undesired material constitutes remnant polysilicon which adheres to the wafer backside during formation of a frontside capacitor storage node. In accordance with this implementation, the wafer backside is mechanically scrubbed prior to formation of a storage capacitor dielectric layer, with such mechanical scrubbing taking place in connection with a polishing solution comprising tetramethyl ammonium hydroxide (TMAH) having a desired concentration.

BRIEF DESCRIPTION OF THE DRAWINGS

Preferred embodiments of the invention are described below with reference to the following accompanying drawings.

FIG. 1 is a flow diagram illustrating certain methodical aspects of the present invention.

FIG. 2 is a diagrammatic sectional view of a semiconductor wafer fragment undergoing processing in accordance with the invention.

FIG. 6 is a diagrammatic sectional view of a semiconductor wafer fragment undergoing processing in accordance with a preferred embodiment of the present invention.

FIG. 7 is a view of the FIG. 6 wafer fragment at a processing step subsequent to that shown by FIG. 6.

FIG. 8 is a view of the FIG. 6 wafer fragment at a processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Referring to FIGS. 1–5, certain methodical aspects of the invention are set forth in a flow diagram (FIG. 1), and an exemplary illustrative implementation follows the flow diagram in FIGS. 2–5.

Referring to FIGS. 1 and 2, a fragmentary semiconductor wafer 10 (FIG. 2) is provided at step 110 (FIG. 1). Wafer 10 includes a wafer frontside 12 and a wafer backside 14. Wafer backside 14 faces generally oppositely away from wafer frontside 12.

Figure 3:
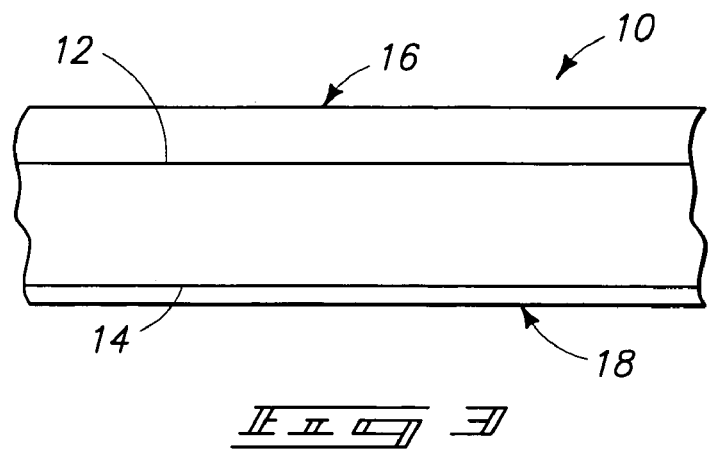
FIG. 3 is a view of the FIG. 2 wafer fragment at a processing step subsequent to that shown by FIG. 2.

Referring to FIGS. 1 and 3, wafer 10, and in particular wafer frontside 12 is subjected to processing conditions which cause an undesired material 18 to adhere or form on at least some of wafer backside 14. Such processing constitutes, at step 112, at least partially forming integrated circuitry 16 relative to wafer frontside 12.

Figure 4:
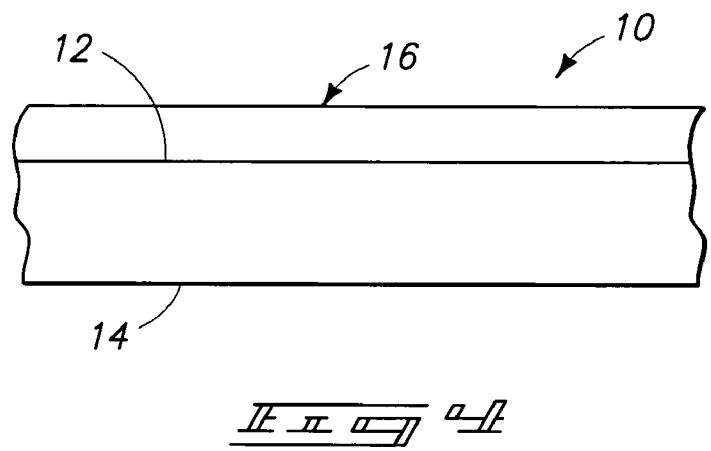
FIG. 4 is a view of the FIG. 2 wafer fragment at a processing step subsequent to that shown by FIG. 3.

Referring to FIGS. 1 and 4, and at step 114, wafer backside 14 is treated to remove at least some, and preferably all of the undesired material 18. In a preferred implementation, wafer backside 14 is treated while wafer frontside 12 is not appreciably treated. Accordingly, treatment of wafer frontside 12 is substantially restricted as will become apparent below. In accordance with one aspect of the invention, the treatment of wafer backside 14 comprises mechanically scrubbing the wafer backside. In accordance with another aspect of the invention, the treatment comprises chemically treating wafer backside 14 with a solution which is effective to facilitate removal of the undesired material. In another aspect, wafer backside 14 can be chemically treated prior to mechanically scrubbing the backside. In a most preferred aspect, the treatment of wafer backside 14 constitutes mechanically scrubbing the wafer backside and chemically treating the wafer backside in the same step or at the same time. Accordingly, in this aspect of the invention, the wafer backside is treated with a solution during the mechanical scrubbing thereof which also imparts a degree of removal by chemical means.

In one implementation, the undesired material 18 constitutes remnant polysilicon material which forms over backside 14 during semiconductor wafer processing. Typically, such is the case because of a desired frontside deposition of polysilicon. In accordance with one aspect of this implementation, the mechanical scrubbing of the wafer backside can comprise using an aqueous polishing solution having at least about 1% by weight tetramethyl ammonium hydroxide (TMAH) during the scrubbing. In accordance with another aspect of this implementation, the mechanical scrubbing comprises using a polishing solution having less than or equal to about 5% by weight TMAH. Alternately, the solution can comprise an aqueous solution of about 4% by weight TMAH.

According to yet another aspect of this implementation, the wafer backside 14 is treated with a solution having at least about 1% by weight TMAH prior to the mechanical scrubbing thereof. Accordingly, such a solution is effective to chemically etch the undesired polysilicon material. Exposure times for such solution can be more or less than about one minute depending on the strength of the polishing solution. For example, utilizing an aqueous solution of about 5% by weight TMAH for the backside scrub, an exposure time of about one minute should be adequate to effectuate removal of the remnant polysilicon. Of course, exposure times can vary. Additionally, other solutions can be utilized such as various HF-based solutions with exemplary solutions being utilized in connection with a hood, spin-etch, or scrub.

Figure 5:
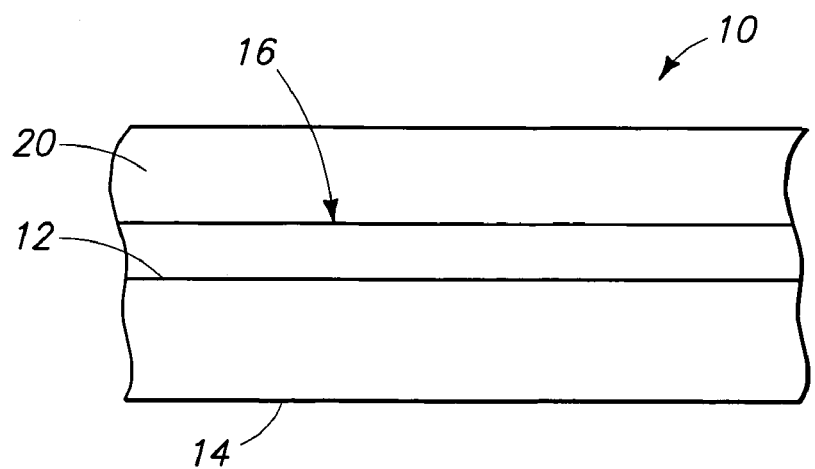
FIG. 5 is a view of the FIG. 2 wafer fragment at a processing step subsequent to that shown by FIG. 4.

Referring to FIGS. 1 and 5, a final passivation layer 20 is formed over wafer frontside 12 at step 116. Typically, such passivation layer is provided after a final metallization layer is patterned. Accordingly, such constitutes forming a final passivation layer over the wafer frontside after scrubbing (either mechanically, chemically, or both) the undesired material from wafer backside 14. After forming final passivation layer 20, the wafer backside 14 can again be mechanically scrubbed to remove any undesired material thereover.

The discussion now proceeds with respect to FIGS. 6–11 which illustrate a preferred implementation of the above-described invention.

Referring to FIG. 6, a fragmentary portion of a semiconductor wafer is indicated generally at 22 and includes a substrate 24. Fragment 22 includes a wafer frontside 26 and a wafer backside 28. Conductive lines 30, 32 are provided over substrate 24, as are source/drain diffusion regions 31, 33, all of which constitute portions of dynamic random access memory (DRAM) circuitry as will become apparent below.

Referring to FIG. 7, a layer 34 of insulative material is formed over wafer frontside 26. An exemplary material is borophosphosilicate glass (BPSG).

Referring to FIG. 8, a capacitor container opening 36 is etched into and through insulative layer 34 to expose diffusion region 31. A layer 38 of storage node material is formed over frontside 26 and within capacitor container opening 36. Exemplary materials for layer 38 include conductively doped polysilicon or so-called rugged-type polysilicon (hemispherical grain or cylindrical grain polysilicon). The storage node material less than fills the capacitor contact opening. A filler material 40 (i.e. photoresist) can be, and preferably is formed over at least portions of the wafer and to a degree which is sufficient to fill the remaining capacitor container opening 36 as shown. Such protects the capacitor container opening from debris which can be generated during subsequent processing. Formation of the above-described storage node material layer 38 also tends to cause remnant polysilicon material 38' to be formed over the wafer backside 28. Such is undesirable, as subsequent processing can cause material 38' to be removed and undesirably partially deposit on wafer frontside 26. This can possibly ruin the integrated circuitry formed thereover.

Figure 9:
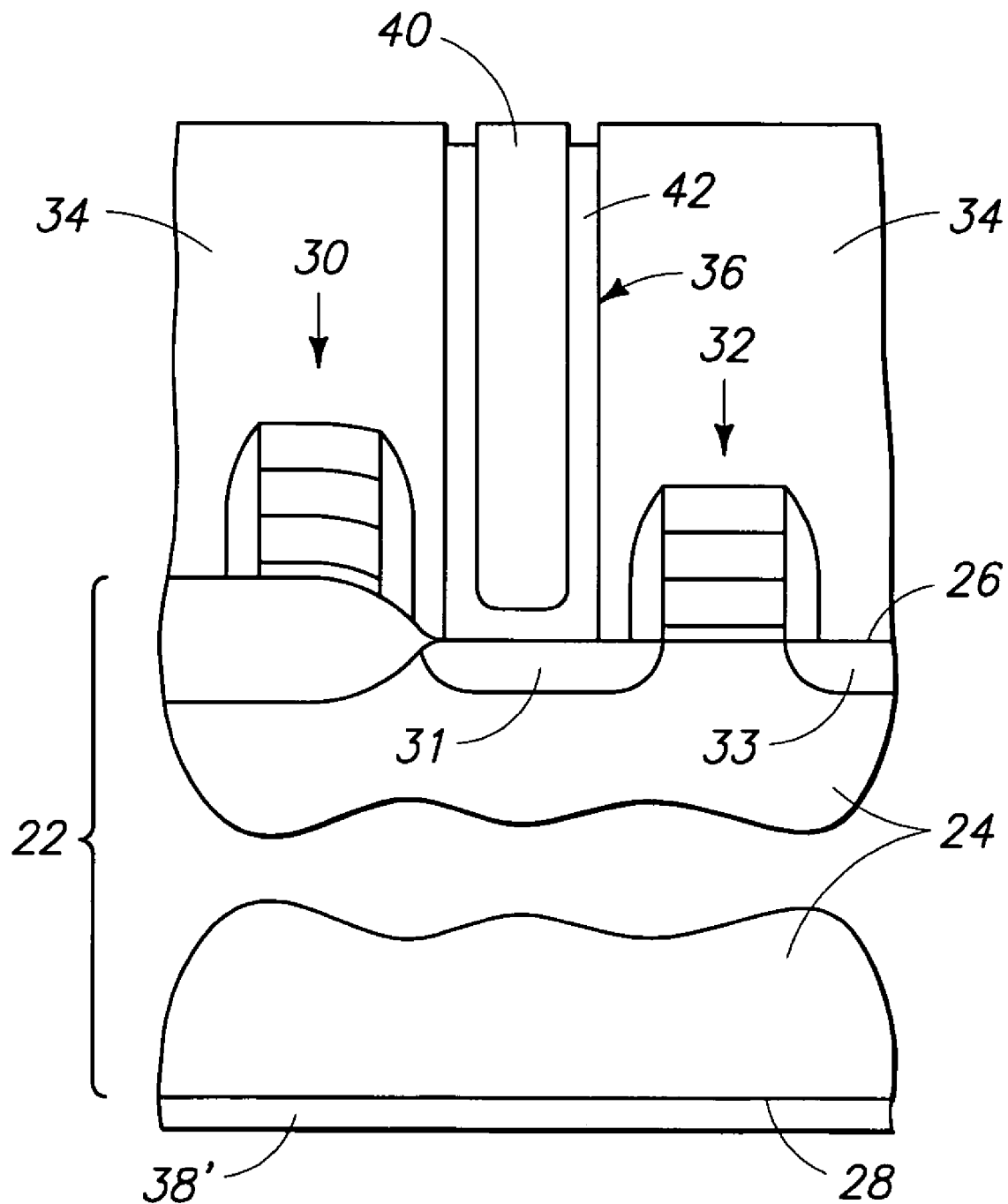
FIG. 9 is a view of the FIG. 6 wafer fragment at a processing step subsequent to that shown by FIG. 8.

Referring to FIG. 9, filler material 40 and layer 38 are planarized relative to insulative layer 34 to isolate storage node material 42 within capacitor container opening 36 as shown. An exemplary planarization of such layers comprises a suitable chemical-mechanical polishing thereof. Such effectively provides a first capacitor plate of a DRAM storage capacitor. Storage node material 42 can be recessed within the capacitor container opening as shown, through a short wet recess step. An exemplary wet recess comprises submerging the wafer in a 1% by weight TMAH solution for about 5 minutes. Such a recess etch removes residual surface polysilicon left over from the aforementioned chemical mechanical process and provides assurance that any conductive material redeposited later atop layer 34 does not cause undesired shorting between storage nodes.

Figure 10:
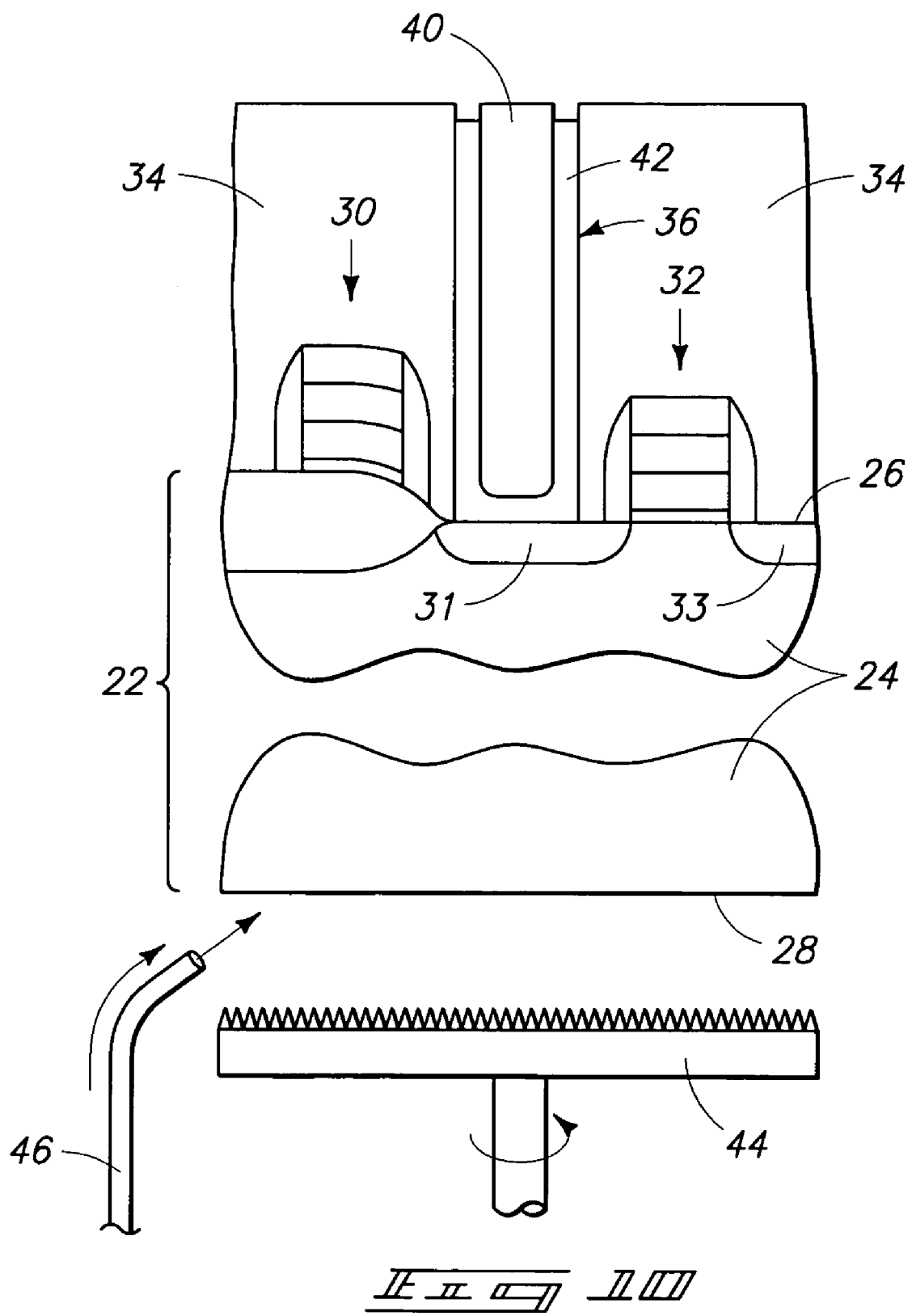
FIG. 10 is a view of the FIG. 6 wafer fragment at a processing step subsequent to that shown by FIG. 9.

Referring to FIG. 10, semiconductor wafer backside 28 is subjected to conditions which are effective to remove at least some, and preferably all, of the undesirable material 38' which may have adhered thereto during prior processing. Preferably, the removal of material 38' takes place prior to forming a capacitor dielectric material over first capacitor plate 42. In accordance with a preferred aspect of the invention, treatment of the wafer frontside 26 is restricted during such processing so that only the backside 28 is meaningfully treated. After the FIG. 9 chemical-mechanical polishing which isolates storage node material 42, wafer backside 28 is mechanically scrubbed by a scrubber 44 to remove undesired storage node material 38' which may have accumulated thereover. The scrubbing action of scrubber 44, which is most preferably rotational, effectively dislodges the undesired material, with gravity serving to allow such dislodged material to drop away from the wafer. In accordance with another preferred aspect of the invention, the mechanical scrubbing of wafer backside 28 is conducted in conjunction with a polishing solution (represented by dispenser 46) which comprises at least about 1% by weight TMAH. Even more preferably, the polishing solution has less than or equal to about 5% by weight TMAH. Greater concentrations are of course possible, such as about 10% or 20% by weight TMAH. Chemical treatment of the wafer backside 28 with TMAH can take place either prior to, during, or after the mechanical scrubbing thereof. Preferably such takes place before as well as during the mechanical scrubbing.

An exemplary and preferred processing apparatus for implementing the above-described scrubbing and treatment is available from DNS Electronics, Sunnyvale, Calif., as Dainippon Screen Cleaner, Model Number AS-2000. The preferred apparatus enables the wafer backside to be processed as described above, while substantially, if not completely, restricting frontside exposure to any of the backside polishing chemistry or processing contaminants mentioned above. The AS-2000 includes rotating backside brushes which, in conjunction with a rotating wafer and the preferred polishing solution, can effectively remove undesired material from the backside. The centrifugal force of the wafer in connection with the influence of gravity serve to direct debris downwardly and away from the wafer. Such constitutes an exemplary treatment or processing of the wafer in which the wafer frontside is not appreciably treated. Accordingly, treatment of the wafer frontside is restricted. Although the AS-2000 processing apparatus is preferred, other processing apparatuses can, of course, be used, e.g., an SSEC Evergreen 200 double-sided wafer cleaner, available from Solid State Equipment Corp., Fort Washington, Pa.

After treatment of the wafer backside as just described, frontside 26 can be scrubbed or otherwise treated with a 0.06% by weight TMAH treatment. Thereafter wafer 22 is subjected to further processing.

Figure 11:
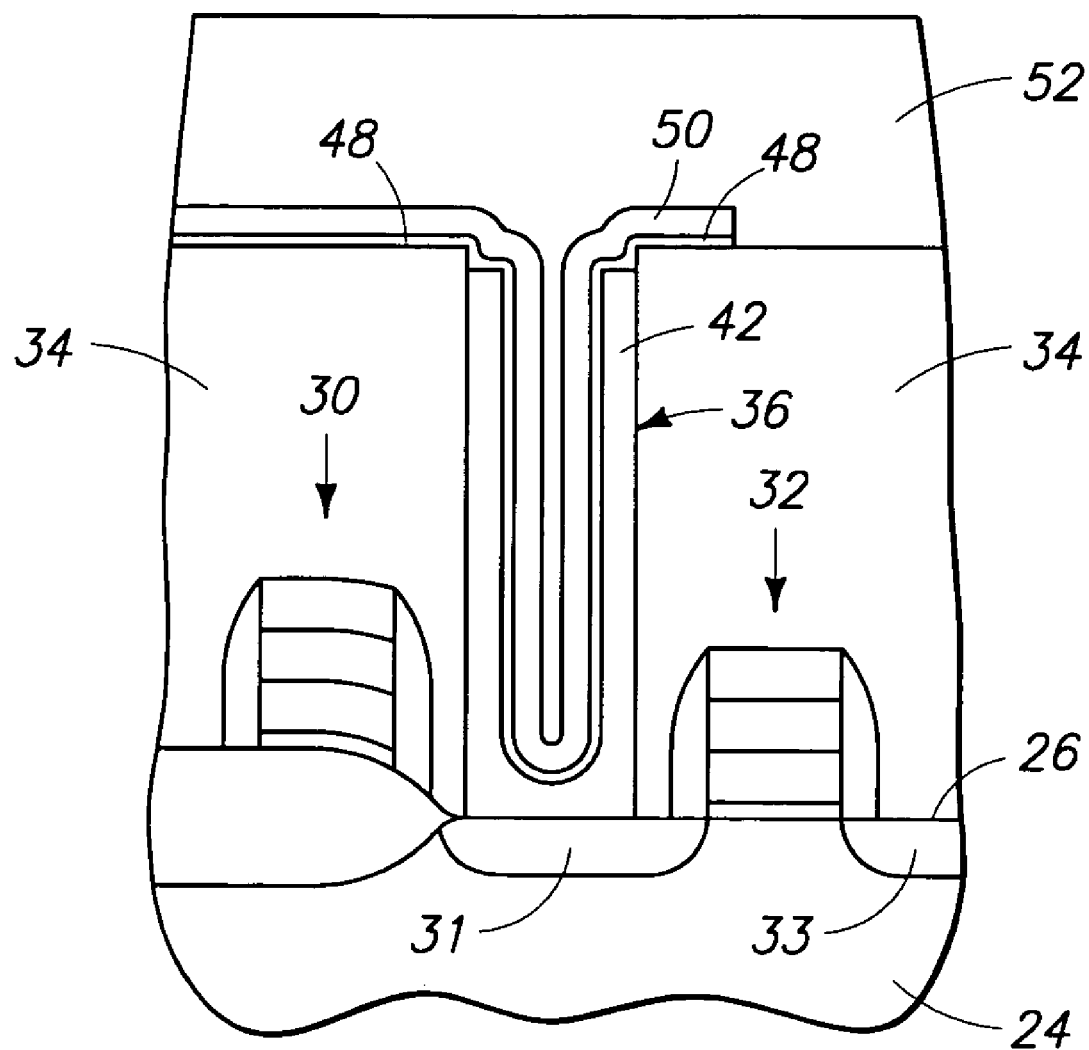
FIG. 11 is a view of the FIG. 6 wafer fragment at a processing step subsequent to that shown by FIG. 10.

Referring to FIG. 11, and following removal of filler material 40 from capacitor container opening 36, a layer 48 of dielectric material is formed over storage node material 42. Subsequently, a cell plate layer or second capacitor plate 50 is formed over dielectric layer 48. Subsequent processing includes patterning and etching the cell plate and dielectric layers to define individual discrete DRAM storage capacitors. Subsequently, after bit line contact formation and other related processing, a final passivation layer 52 is formed over wafer frontside 26. Following formation of the final passivation layer, wafer backside 28 can be mechanically scrubbed again to ensure removal of any additional undesired material.

The above-described methodology enables potential contaminants to be removed from a wafer backside before formation of a final passivation layer. The effective isolated treatment of the wafer backside relative to the wafer frontside allows a stronger concentration of polishing solution to be used to remove the undesired material from the wafer backside. Additionally, the abrasive action of the backside scrubbing brushes reduces the wafer's exposure time to the stronger concentration of polishing solution because the combined effect of the backside brushes and the polishing solution removes the material faster than would otherwise be possible using only the polishing solution. This further reduces the chances of a frontside contamination. While the inventive methodology has been described, in the preferred embodiment, in the context of removing polysilicon from the wafer's backside, it is to be understood that such methodology is not to be so limited or construed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
   providing a semiconductor wafer having a frontside and a backside;
   depositing polysilicon-comprising material onto the wafer frontside and backside;
   treating the semiconductor wafer backside while restricting treatment of the wafer frontside to remove at least some of the polysilicon from the wafer backside, the treating comprising first chemically etching the semiconductor wafer backside without mechanical scrubbing; and after beginning said chemically etching without mechanical scrubbing, mechanically scrubbing the semiconductor wafer backside while continuing chemical etching; and
   after the treating of the semiconductor wafer backside, forming a final passivation layer over the semiconductor wafer frontside.

2. The method of claim 1 further comprising after forming the final passivation layer, mechanically scrubbing the wafer backside.

3. The method of claim 1 wherein the treating removes all of the polysilicon-comprising material from the wafer backside.

4. The method of claim 1 wherein the chemically etching comprises an etching solution having at least about 1% by weight tetramethyl ammonium hydroxide.

5. The method of claim 4 wherein the chemically etching prior to starting the mechanical scrubbing is for more than one minute.

6. The method of claim 4 wherein the chemically etching prior to starting the mechanical scrubbing is for less than one minute.

7. The method of claim 4 wherein the chemically etching prior to starting the mechanical scrubbing is for one minute.

8. The method of claim 1 wherein the chemically etching comprises an etching solution having about 5% by weight tetramethyl ammonium hydroxide.

9. The method of claim 1 wherein the chemically etching comprises an etching solution comprising HF.

10. A semiconductor processing method comprising:
    providing a semiconductor wafer having a frontside and a backside;
    depositing polysilicon-comprising material onto the wafer frontside and backside;
    treating the semiconductor wafer backside to remove at least some of the polysilicon-comprising material, the treating comprising first chemically etching the semiconductor wafer backside without mechanical scrubbing; and after beginning said chemically etching without mechanical scrubbing, mechanically scrubbing the semiconductor wafer backside while continuing chemical etching; and
    after the treating of the semiconductor wafer backside, forming a final passivation layer over the semiconductor wafer frontside.

11. The method of claim 10 further comprising after forming the final passivation layer, mechanically scrubbing the wafer backside.

12. The method of claim 10 wherein the treating removes all of the polysilicon-comprising material from the wafer backside.

13. The method of claim 10 wherein the chemically etching comprises an etching solution having at least about 1% by weight tetramethyl ammonium hydroxide.

14. The method of claim 13 wherein the chemically etching prior to starting the mechanical scrubbing is for more than one minute.

15. The method of claim 13 wherein the chemically etching prior to starting the mechanical scrubbing is for less than one minute.

16. The method of claim 13 wherein the chemically etching prior to starting the mechanical scrubbing is for one minute.

17. The method of claim 10 wherein the chemically etching comprises an etching solution having about 5% by weight tetramethyl ammonium hydroxide.

18. The method of claim 10 wherein the chemically etching comprises an etching solution comprising HF.

19. The method of claim 1 wherein the chemically etching comprises an etching solution comprising tetramethyl ammonium hydroxide.

20. The method of claim 10 wherein the chemically etching comprises an etching solution comprising tetramethyl ammonium hydroxide.

21. A processing method of forming integrated circuitry comprising:
    providing a semiconductor wafer having a frontside for supporting integrated circuitry and a backside which faces generally oppositely away from the frontside;
    at least partially forming integrated circuitry relative to the semiconductor wafer frontside, the at least partially forming integrated circuitry comprising:
    forming a layer of insulative material over the semiconductor wafer frontside;
    etching a capacitor container opening into the layer of insulative material;
    forming a layer of storage node material comprising polysilicon over the semiconductor wafer frontside and within the capacitor container opening to less than fill the capacitor container opening, the polysilicon-comprising storage node material forming on the wafer backside while forming on the wafer frontside;
    forming a filler material over at least the polysilicon-comprising storage node material on the wafer frontside to a degree sufficient to fill the remaining capacitor container opening;
    planarizing the polysilicon-comprising storage node material and the filler material relative to the layer of insulative material;
    after the planarizing, chemically etching the polysilicon-comprising storage node material to recess it relative to the insulative material and the filler material;
    after the chemically etching, mechanically scrubbing the polysilicon-comprising storage node material from the semiconductor wafer backside;
    after mechanically scrubbing of the polysilicon-comprising storage node material from the wafer backside, forming a final passivation layer over the semiconductor wafer frontside; and
    after the chemically etching, treating the wafer backside with a solution without mechanical scrubbing prior to said mechanically scrubbing and while substantially restricting the wafer frontside from such treating.

22. The method of claim 21 wherein the solution comprising tetramethyl ammonium hydroxide.

23. The method of claim 22 wherein the solution has less than or equal to about 5% by weight tetramethyl ammonium hydroxide.

24. The method of claim 22 wherein the solution has at least about 1% by weight tetramethyl ammonium hydroxide.

25. The method of claim 22 wherein the solution has about 4% by weight tetramethyl ammonium hydroxide.

26. The method of claim 22 wherein the solution has greater than about 5% by weight tetramethyl ammonium hydroxide.

27. The method of claim 26 wherein the solution has about 10% by weight tetramethyl ammonium hydroxide.

28. The method of claim 26 wherein the solution has about 20% by weight tetramethyl ammonium hydroxide.

29. The method of claim 21 wherein the chemically etching comprises submerging the wafer in a tetramethyl ammonium hydroxide solution.

30. The method of claim 1 wherein the treating removes all of the polysilicon-comprising material from the wafer backside; and further comprising after forming the final passivation layer, mechanically scrubbing the wafer backside.

31. The method of claim 30 wherein the chemically etching comprises an etching solution having about 5% by weight tetramethyl ammonium hydroxide.

32. The method of claim 30 wherein the solution has greater than about 5% by weight tetramethyl ammonium hydroxide.

33. The method of claim 10 wherein the treating removes all of the polysilicon-comprising material from the wafer backside; and further comprising after forming the final passivation layer, mechanically scrubbing the wafer backside.

34. The method of claim 33 wherein the chemically etching comprises an etching solution having about 5% by weight tetramethyl ammonium hydroxide.

35. The method of claim 33 wherein the solution has greater than about 5% by weight tetramethyl ammonium hydroxide.

36. The method of claim 19 wherein the solution has greater than about 5% by weight tetramethyl ammonium hydroxide.

37. The method of claim 20 wherein the solution has greater than about 5% by weight tetramethyl ammonium hydroxide.

* * * * *

UNITED STATES PATENT AND TRADEMARK OFFICE
CERTIFICATE OF CORRECTION

PATENT NO. : 7,151,026 B2 Page 1 of 1
APPLICATION NO. : 11/291508
DATED : December 19, 2006
INVENTOR(S) : Andreas It is certified that error appears in the above-identified patent and that said Letters Patent is hereby corrected as shown below:

Col. 8, lines 5-6, claim 22, please delete "comprising" after "solution" and insert --comprises--.

Signed and Sealed this

Fourteenth Day of August, 2007

JON W. DUDAS
*Director of the United States Patent and Trademark Office*